United States Patent
Bhattacharjee et al.

(10) Patent No.: US 11,663,119 B2
(45) Date of Patent: May 30, 2023

(54) SELECT DECOMPRESSION HEADERS AND SYMBOL START INDICATORS USED IN WRITING DECOMPRESSED DATA

(71) Applicant: INTERNATIONAL BUSINESS MACHINES CORPORATION, Armonk, NY (US)

(72) Inventors: Deepankar Bhattacharjee, Bangalore (IN); Girish Gopala Kurup, Bangalore (IN); Ashutosh Misra, Lagrangeville, NY (US); Puja Sethia, Bengaluru (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 184 days.

(21) Appl. No.: 16/886,943

(22) Filed: May 29, 2020

(65) Prior Publication Data
US 2021/0374049 A1 Dec. 2, 2021

(51) Int. Cl.
*G06F 12/02* (2006.01)
*G06F 12/0855* (2016.01)
*G06F 9/54* (2006.01)

(52) U.S. Cl.
CPC .......... *G06F 12/0246* (2013.01); *G06F 9/544* (2013.01); *G06F 9/546* (2013.01); *G06F 12/0855* (2013.01); *G06F 2212/401* (2013.01)

(58) Field of Classification Search
CPC ...... G06F 12/0246; G06F 9/544; G06F 9/546; G06F 12/0855; G06F 2212/401;
(Continued)

(56) References Cited

U.S. PATENT DOCUMENTS 5,051,745 A * 9/1991 Katz .................. H03M 7/3086
341/51
9,047,959 B1 * 6/2015 Myouga .............. G06F 12/0246
(Continued)

OTHER PUBLICATIONS

IBM, "z/ Architecture—Principles of Operation," IBM Publication No. SA22-7832-12, Thirteenth Edition, Sep. 2019, pp. 1-2000.
(Continued)

*Primary Examiner* — Charles Rones
*Assistant Examiner* — Alexander Vinnitsky
(74) *Attorney, Agent, or Firm* — Edward J. Wixted, III, Esq.; Blanche E. Schiller, Esq.; Heslin Rothenberg Farley & Mesiti P.C.

(57) ABSTRACT

One or more units of decompressed data of a plurality of units of decompressed data is written to a target location for subsequent writing to memory. The plurality of units of decompressed data includes a plurality of symbol outputs and has associated therewith a plurality of decompression headers. A determination is made that the subsequent writing to memory of at least a portion of another unit of decompressed data to be written to the target location is to be stalled. A symbol start position of the other unit of decompressed data and a decompression header of a selected unit of the one or more units of decompressed data written to the target location are provided to a component of the computing environment. The decompression header is used for the subsequent writing of the other unit of decompressed data to memory.

20 Claims, 14 Drawing Sheets

(58) Field of Classification Search
CPC ..... G06F 2212/1044; G06F 2212/1056; G06F 12/04; H03M 7/30
See application file for complete search history.

(56) References Cited

U.S. PATENT DOCUMENTS

| | | | |
|---|---|---|---|
| 9,584,156 | B1 | 2/2017 | Abali et al. |
| 10,587,287 | B2* | 3/2020 | Sofia ........................ G06F 8/65 |
| 10,630,312 | B1* | 4/2020 | Giamei ............... H03M 7/3084 |
| 10,652,597 | B2* | 5/2020 | Iguchi .............. H04N 21/43072 |
| 10,698,854 | B1* | 6/2020 | Weishaupt .......... G06F 13/4068 |
| 10,831,497 | B2* | 11/2020 | Giamei ............... G06F 9/30145 |
| 2005/0210179 | A1* | 9/2005 | Walmsley ............. G06F 21/445 |
| | | | 711/3 |
| 2012/0045139 | A1 | 2/2012 | Demidov et al. |
| 2016/0323342 | A1 | 11/2016 | Luby et al. |
| 2016/0380649 | A1 | 12/2016 | Henry et al. |

OTHER PUBLICATIONS

Mell, Peter and Tim Grance, "The NIST Definition of Cloud Computing," National Institute of Standards and Technology, Information Technology Laboratory, Special Publication 800-145, Sep. 2011, pp. 1-7.

* cited by examiner

SELECT DECOMPRESSION HEADERS AND SYMBOL START INDICATORS USED IN WRITING DECOMPRESSED DATA

BACKGROUND

One or more aspects relate, in general, to processing within a computing environment, and in particular, to facilitating decompression operations within the computing environment.

In one or more computing environments, a compressed form of information, rather than the original, uncompressed form, is maintained on storage devices. The compressed form occupies less bytes than the original form. As a result, transmitting and maintaining a compressed form of information requires less time and space, respectively, compared to performing the same functions with the original form of the information.

A mechanism is provided, in one example, to perform the compressing and decompressing operations. For instance, a DEFLATE standard compression technique, specified in the IETF (Internet Engineering Task Force) RFC (Request for Comments) 1951 specification, is employed. This technique includes a DEFLATE instruction, which is a complex instruction which can take many cycles to complete. One architecture that includes such an instruction (e.g., a DEFLATE Conversion Call instruction) is the z/Architecture® hardware architecture, offered by International Business Machines Corporation, Armonk, N.Y. z/Architecture is a trademark or registered trademark of International Business Machines Corporation in at least one jurisdiction.

From an architectural perspective, a DEFLATE instruction follows the same principle rules as other architected instructions. When the DEFLATE instruction is called, a source and target buffer are provided by software. The machine is to fully consume at least one of those buffers (or complete successfully with the available buffers).

A DEFLATE instruction is supplied with the source page addresses from where data is to be fetched to be compressed/decompressed and target page addresses to which the result of compression/decompression is stored.

SUMMARY

Shortcomings of the prior art are overcome, and additional advantages are provided through the provision of a computer program product for facilitating processing within a computing environment. The computer program product includes at least one computer readable storage medium readable by at least one processing circuit and storing instructions for performing a method. The method includes writing one or more units of decompressed data of a plurality of units of decompressed data to a target location for subsequent writing to memory. The plurality of units of decompressed data includes a plurality of symbol outputs and has associated therewith a plurality of decompression headers. A decompression header of the plurality of decompression headers includes information relating to decompression of data of a unit of decompressed data of the plurality of units of decompressed data. A determination is made that the subsequent writing to memory of at least a portion of another unit of decompressed data of the plurality of units of decompressed data to be written to the target location is to be stalled. The other unit of decompressed data includes one or more symbol outputs of the plurality of symbol outputs. A determination is made of a symbol start position of a selected symbol output of the one or more symbol outputs of the other unit of decompressed data. A determination is made of a selected decompression header of a selected unit of decompressed data of the one or more units of decompressed data written to the target location. The symbol start position and the selected decompression header are provided to a component of the computing environment, and at least the selected decompression header is to be used for the subsequent writing of the other unit of decompressed data from the target location to memory.

Computer-implemented methods and systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1B:
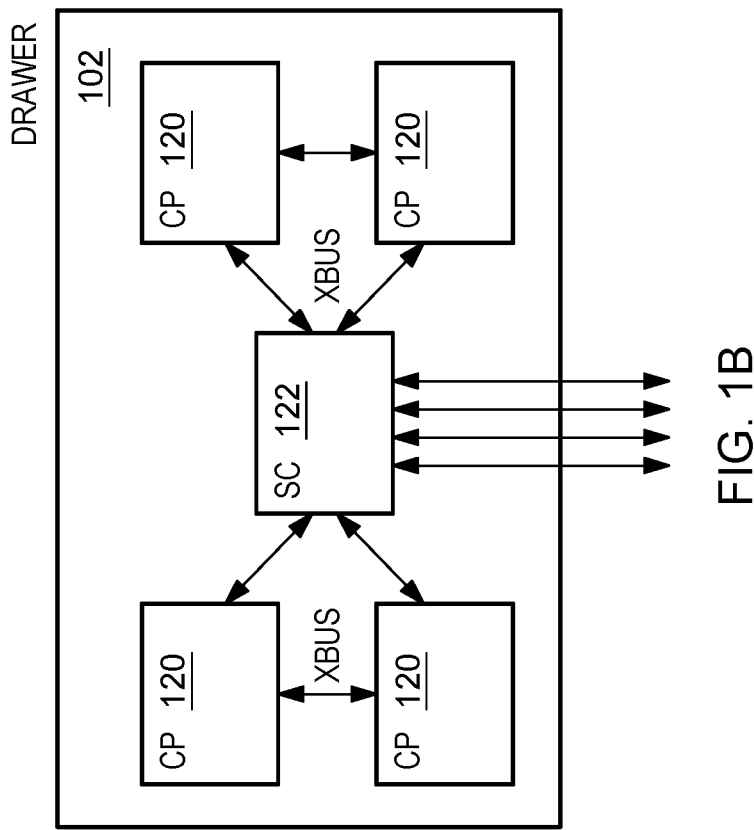
FIG. 1B depicts one example of further details of a drawer of the plurality of interconnected drawers of FIG. 1A, in accordance with one or more aspects of the present invention.

In accordance with one or more aspects, a capability is provided to efficiently decompress a stream of compressed data for, e.g., variable target length applications. In one example, the stream of compressed data is a deflate stream. A deflate stream is a stream compressed/decompressed using the DEFLATE technique. A deflate stream can contain multiple Dynamic Huffman Table (DHT) blocks. For instance, a deflate stream can have a new DHT block associated with each byte of decompressed data, have a DHT block associated with multiple bytes of decompressed data, and/or not have a DHT block for a particular byte, since that byte was not decompressed using a DHT. Each DHT block has associated therewith a header that provides certain information regarding the decompression (e.g., type of decompression and/or other information). As examples, the header may be a part of the DHT block or separate therefrom.

A decompression operation on a deflate stream can have multiple DHT blocks in different stages of a decompression pipeline which can generate from 1 to 258 bytes of decompressed data (also referred to as uncompressed data) for a given compressed symbol. This decompressed data is packed into n byte units of decompressed data (e.g., 8 byte units of data—double words (DWs)) and written to a target location (e.g., a buffer, a queue, etc.) in, for instance, a memory interface block or other location for subsequent writing to memory. The decompressed data may or may not fit into the available location(s) (e.g., pages) in memory, and thus, a backtrack mechanism is used to identify the correct DHT header (e.g., approximately a few hundred bytes) corresponding to the last committed byte to the memory having a DHT block.

In one example, to identify the correct DHT header corresponding to the last committed byte to the memory having a DHT block, a first symbol start position of the next byte to be written is saved and used to identify the correct DHT header. The correct DHT header is used upon a resume operation in which next data is processed (e.g., decompressed and written from the target location to memory).

An optimal design of a decompression operation is provided that handles multiple DHT blocks of deflate data and has efficient throughput of decompressed data through the decompression pipleline while using minimal hardware memory blocks to store the DHT headers. In accordance with one or more aspects of the present invention, particular DHT headers and particular first symbol start indicators or positions are selected and used in writing decompressed data to memory. Further, in one embodiment, particular DHT headers are used to resume decompression of the data and the writing of the decompressed data to memory based on the writing being stalled (e.g., temporarily stopped or interrupted).

One embodiment of a computing environment to incorporate and use one or more aspects of the present invention is described with reference to FIGS. 1A-1D. In one example, the computing environment is based on the z/Architecture® hardware architecture, offered by International Business Machines Corporation, Armonk, N.Y. One embodiment of the z/Architecture hardware architecture is described in "z/Architecture Principles of Operation," IBM Publication No. SA22-7832-12, Thirteenth Edition, September 2019, which is hereby incorporated herein by reference in its entirety. z/Architecture and IBM are trademarks or registered trademarks of International Business Machines Corporation in at least one jurisdiction.

Figure 1A:
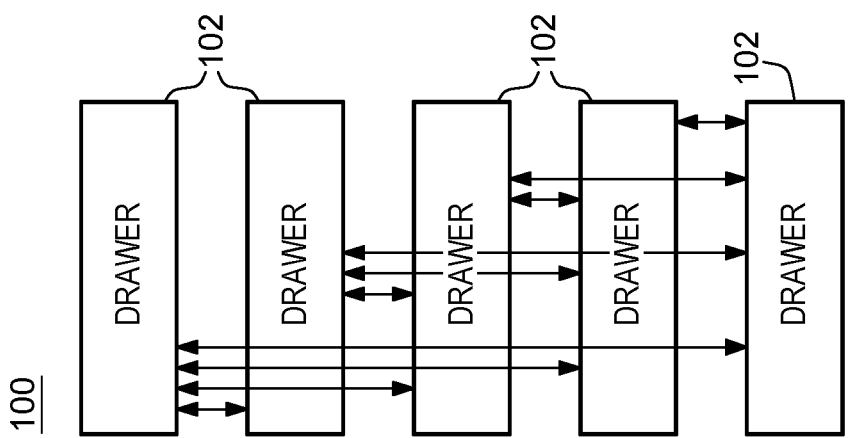
FIG. 1A depicts one example of a plurality of interconnected drawers of a computing environment to incorporate and use one or more aspects of the present invention.
Figure 1C:
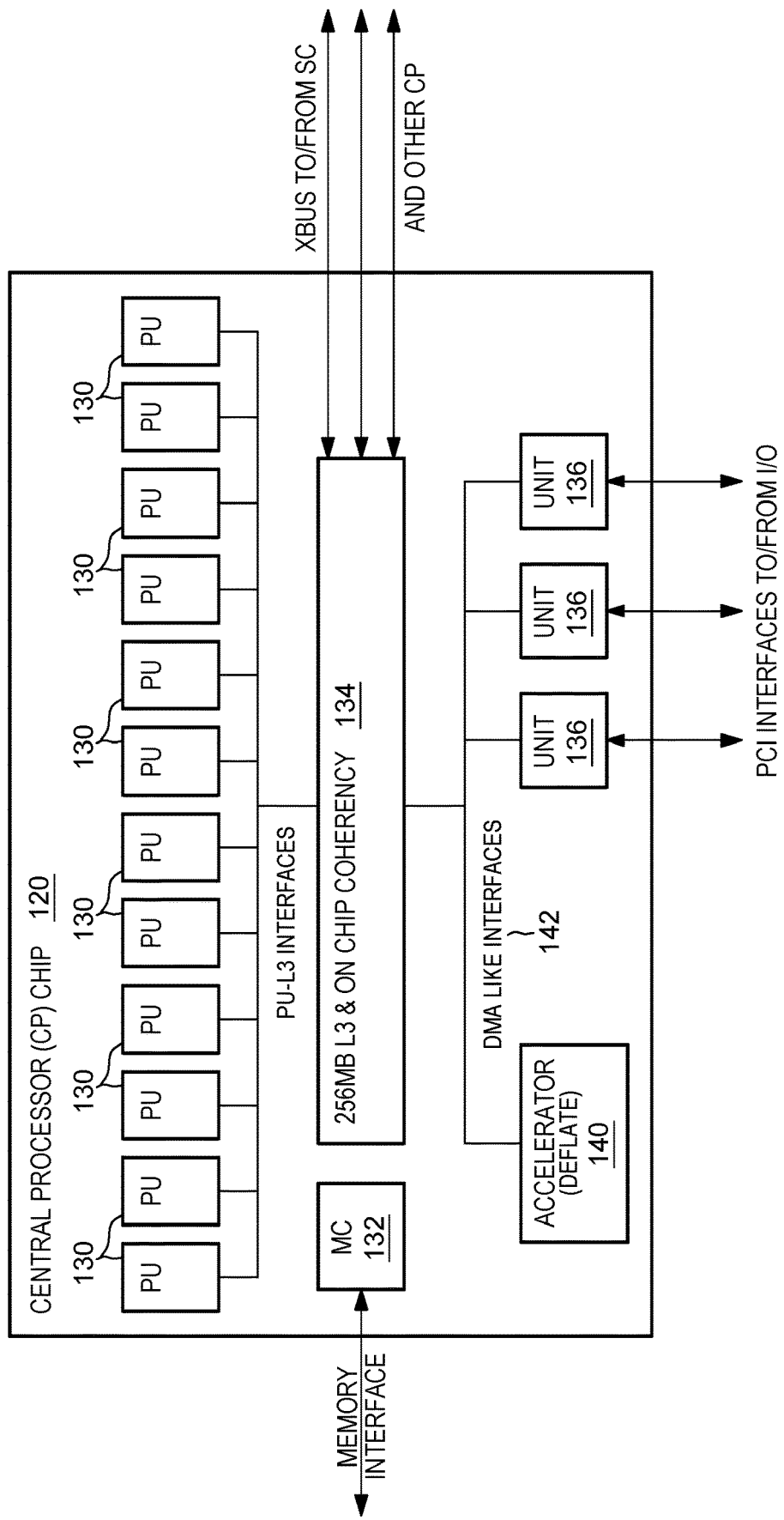
FIG. 1C depicts one example of further details of a central processor (CP) chip of the drawer of FIG. 1B, in accordance with one or more aspects of the present invention.

Referring to FIG. 1A, as an example, a computing environment 100 includes a plurality of interconnected drawers 102. A drawer 102, as depicted in FIG. 1B, includes a plurality of central processor (CP) chips 120 coupled to a system controller (SC) 122. System controller 122 is used to interconnect drawers of the plurality of drawers. Further details relating to a central processor chip 120 are described with reference to FIG. 1C.

In one example, central processor chip 120 includes a plurality of processors (PUs or CPUs) 130 (also referred to as cores), and a memory controller 132 to control access to memory. Each of the plurality of processors includes one or more private caches, such as L1 and L2 caches, and is coupled to a shared cache 134, such as a shared L3 cache. In one example, shared cache 134 is coupled to a plurality of units 136 that couple on-chip components to PCI (Peripheral Component Interconnect) interfaces to/from input/output (I/O) devices. Further, in one example, shared cache 134 is coupled to an accelerator 140 via, for instance, an input/output interface, such as a direct memory access (DMA) or similar interface 142.

Accelerator 140 is used, for instance, to perform particular operations (e.g., compression/decompression operations) of an instruction executing on a processor coupled thereto and/or to run selected instructions. In one particular example, the DEFLATE instruction runs on accelerator 140. On the target side, a nest accelerator unit, as an example, is to be able to completely fill a target buffer, even if the produced output overflows the available target versus stopping when the target buffer is about to run out.

Figure 1D:
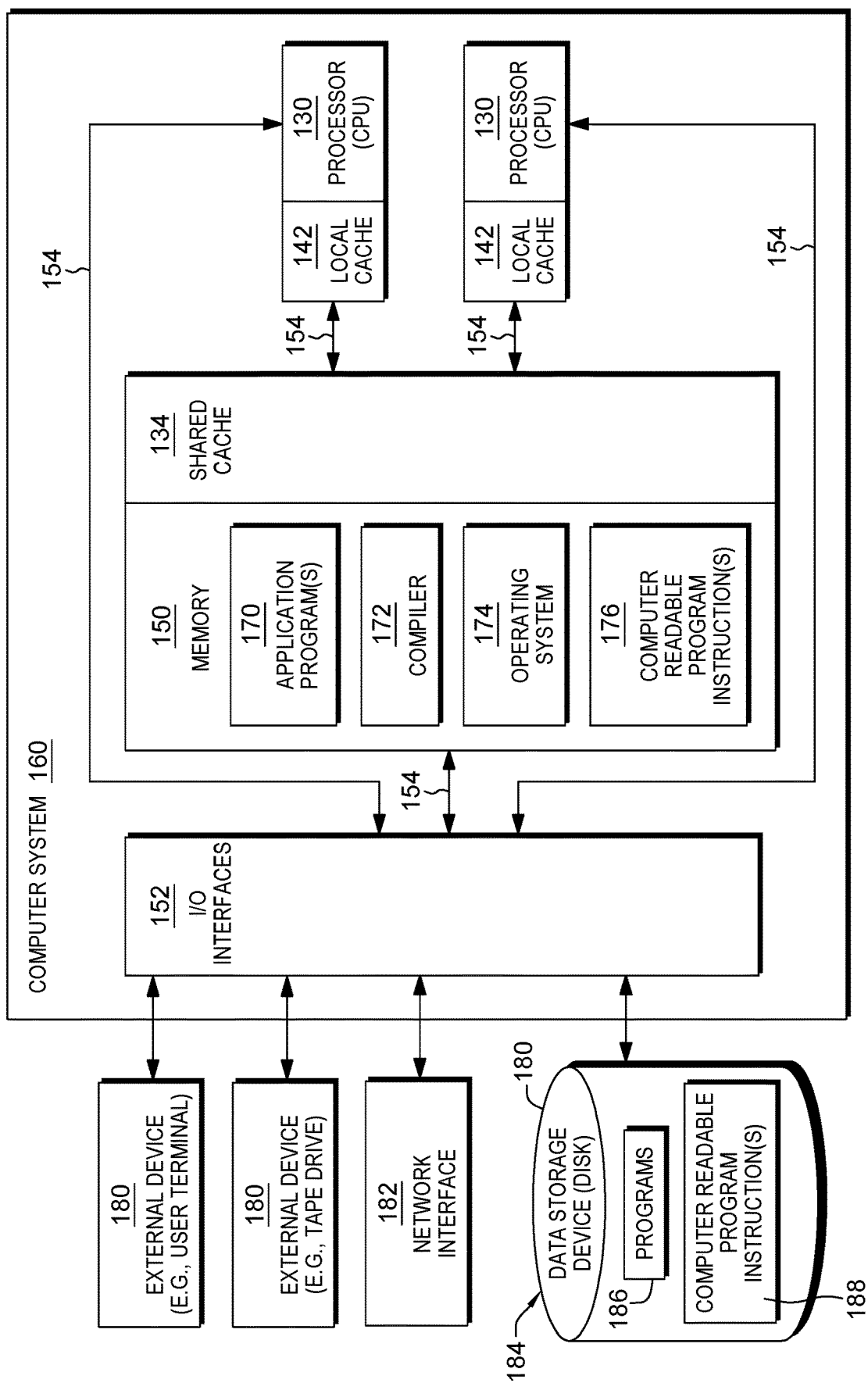
FIG. 1D depicts additional details of one example of the computing environment of FIG. 1A, in accordance with one or more aspects of the present invention.

In one example, as depicted in FIG. 1D, shared cache 134 is coupled to memory 150 (a.k.a., system memory, main memory, main storage, central storage or storage, as examples) and to local caches 142 of processors 130. Further, memory 150 and processors 130 are coupled to one or more input/output (I/O) interfaces 152 via one or more buses and/or other connections 154. The processors, memory, shared and local caches, I/O interfaces and buses are referred to herein as a computer system 160. Computer system 160 may include additional, fewer and/or different components.

Bus 154 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 150 may include one or more programs or applications 170, a compiler 172, an operating system 174 (e.g., such as a z/OS® or MVS™ (Multiple Virtual Storage) operating system, offered by International Business Machines Corporation, or other operating systems), and one or more computer readable program instructions 176. Computer readable program instructions 176 may be configured to carry out functions of embodiments of aspects of the invention. z/OS and MVS are trademarks or registered trademarks of International Business Machines Corporation in at least one jurisdiction.

Computer system 160 may also communicate via, e.g., I/O interfaces 152 with one or more external devices 180 and/or one or more network interfaces 182. Example external devices include a user terminal, data storage devices, such as a tape drive, disk or other data storage devices, a pointing device, a display, etc. In one particular example, a data storage device 184 may store one or more programs 186, one or more computer readable program instructions 188, and/or data, etc. The computer readable program instructions may be configured to carry out functions of embodiments of aspects of the invention.

Network interface 182 enables computer system 160 to communicate with one or more networks, such as a local area network (LAN), a general wide area network (WAN), and/or a public network (e.g., the Internet), providing communication with other computing devices or systems.

Computer system 160 may include and/or be coupled to removable/non-removable, volatile/non-volatile computer system storage media. For example, it may include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 160. Examples, include, but are not limited to: microcode, device drivers, redundant processing units, external disk drive arrays, RAID systems, tape drives, and data archival storage systems, etc.

Computer system 160 may be operational with numerous other general-purpose or special-purpose computing system environments or configurations. Examples of well-known computing systems, environments, and/or configurations that may be suitable for use with computer system 160 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

One or more components of computer system 160 and/or of central processor chip 120, such as one or more processors 130 and/or accelerator 140, execute instructions, including instructions that perform compression/decompression operations. An example instruction that performs compression/decompression operations is a DEFLATE Conversion Call instruction implemented in the z/Architecture hardware architecture. The DEFLATE Conversion Call instruction performs functions related to transforming the state of data between the original (uncompressed) form of the data and a compressed representation of the data, as specified by a selected standard, such as the IETF (Internet Engineering Task Force) RFC (Request for Comments) 1951 specification, which is described in the DEFLATE Compressed Data Format Specification Version 1.3 Internet Engineering Task Force, Request for Comments 1951, May 1996. The DEFLATE standard includes descriptions for compressed data symbols which represent duplicate strings in the original form of the data (in the uncompressed form of the data). Such symbols include a pointer and a length of a duplicate string which describe the location and length of the duplicate string, which was previously processed, in relationship to the current location of data being processed. The previously processed uncompressed form of the data is referred to as history. In one example, the history is a contiguous number of bytes in memory, which can be as large as, for instance, 32 K-bytes.

The DEFLATE Conversion Call instruction is a single instruction (e.g., a single architected hardware machine instruction at the hardware/software interface) that is part of a general-purpose processor instruction set architecture (ISA). A program may execute the DEFLATE Conversion Call instruction multiple times to compress or uncompress a single data stream. For instance, when an application compresses or decompresses a large data stream (e.g., greater than 1 M-bytes), the operation may include multiple calls to compress or decompress buffered portions of the data stream.

Figure 2:
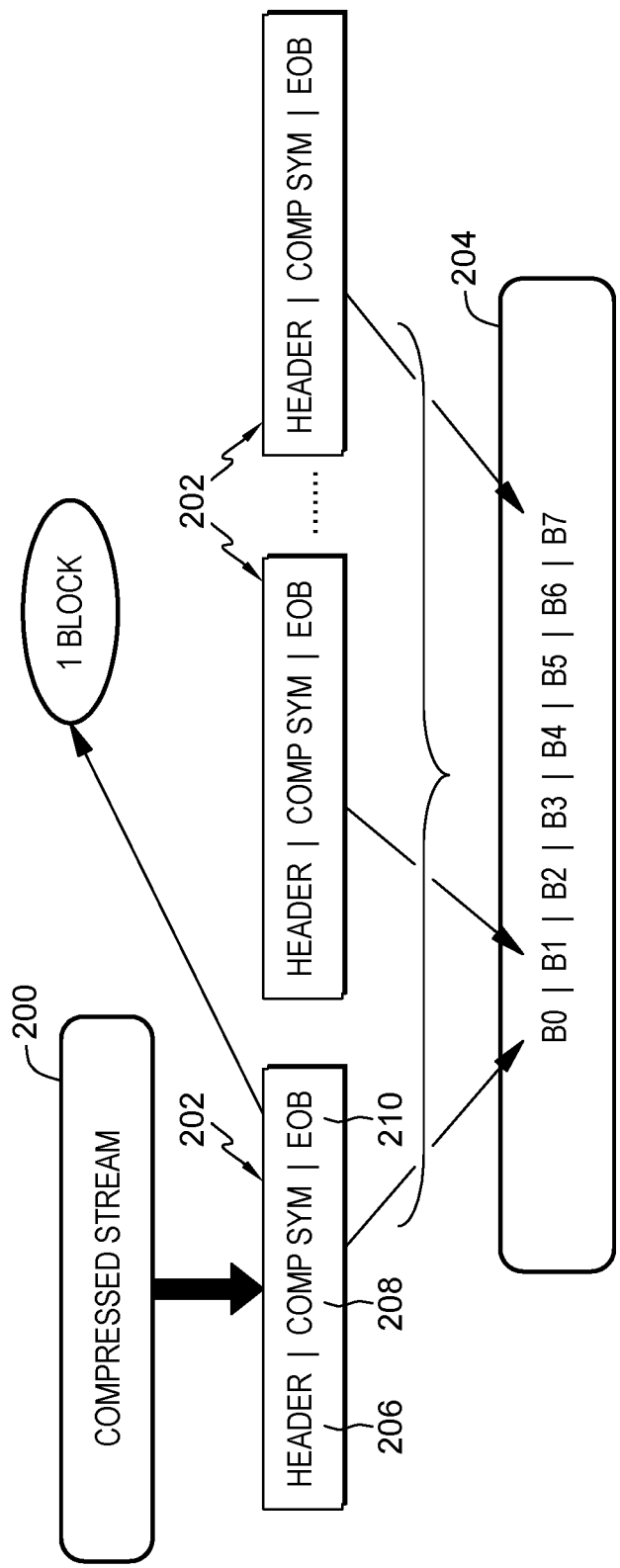
FIG. 2 depicts one example of a compressed stream used in accordance with one or more aspects of the present invention.

One example of a compressed stream is depicted in FIG. 2. A compressed stream 200 includes, for instance, a plurality of compressed blocks 202. As an example, compressed stream 200 includes eight compressed blocks 204 (B0-B7). Each compressed block 202 includes, for instance, a header 206, a compressed symbol 208, and an end of block indication 210.

Figure 3:
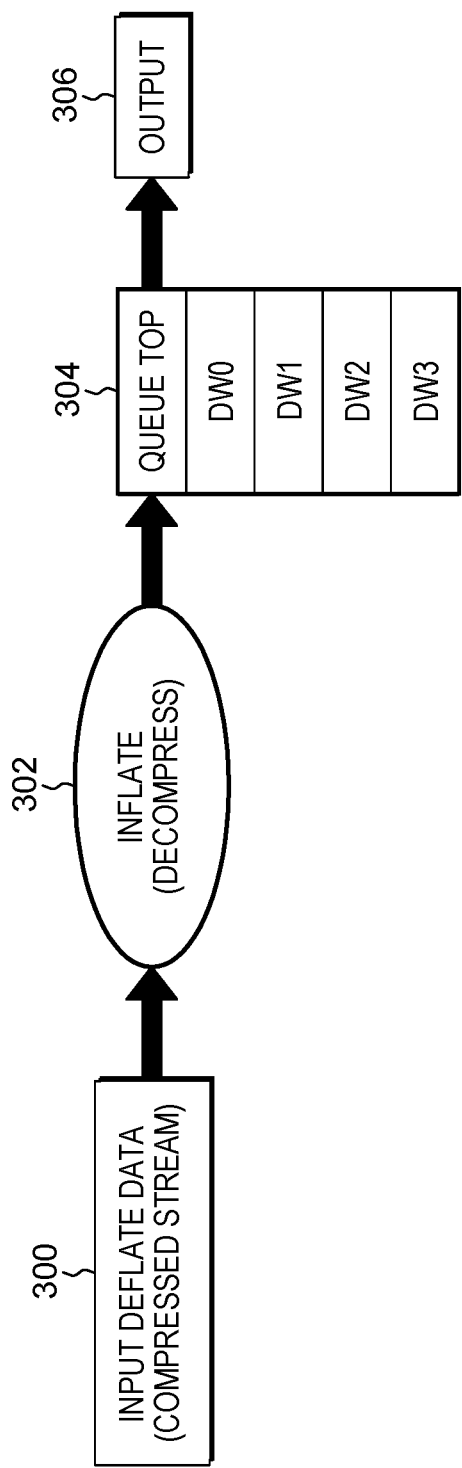
FIG. 3 depicts one example of a data flow to decompress compressed data, in accordance with one or more aspects of the present invention.

A compressed stream, e.g., compressed stream 200, is compressed using a compression technique, such as provided by the DEFLATE technique. Further, a compressed stream may be decompressed using a decompression technique, such as provided by the DEFLATE technique. As shown in FIG. 3, a compressed stream (e.g., compressed stream 200) is input 300 to a decompression technique 302 (also referred to as inflate). Each compressed block of the compressed stream is decompressed producing, e.g., 1-258 bytes of decompressed data for each compressed symbol. Multiple bytes of decompressed data (e.g., 8 bytes) are packed into a unit of decompressed data of a select size (e.g., 8-byte data; i.e., a double word (DW)). Multiple units of decompressed data are stored to an output queue 304 or buffer and ultimately written as output 306 to memory. As an example, each entry of the output queue includes a double word (DW) of data.

Figure 4:
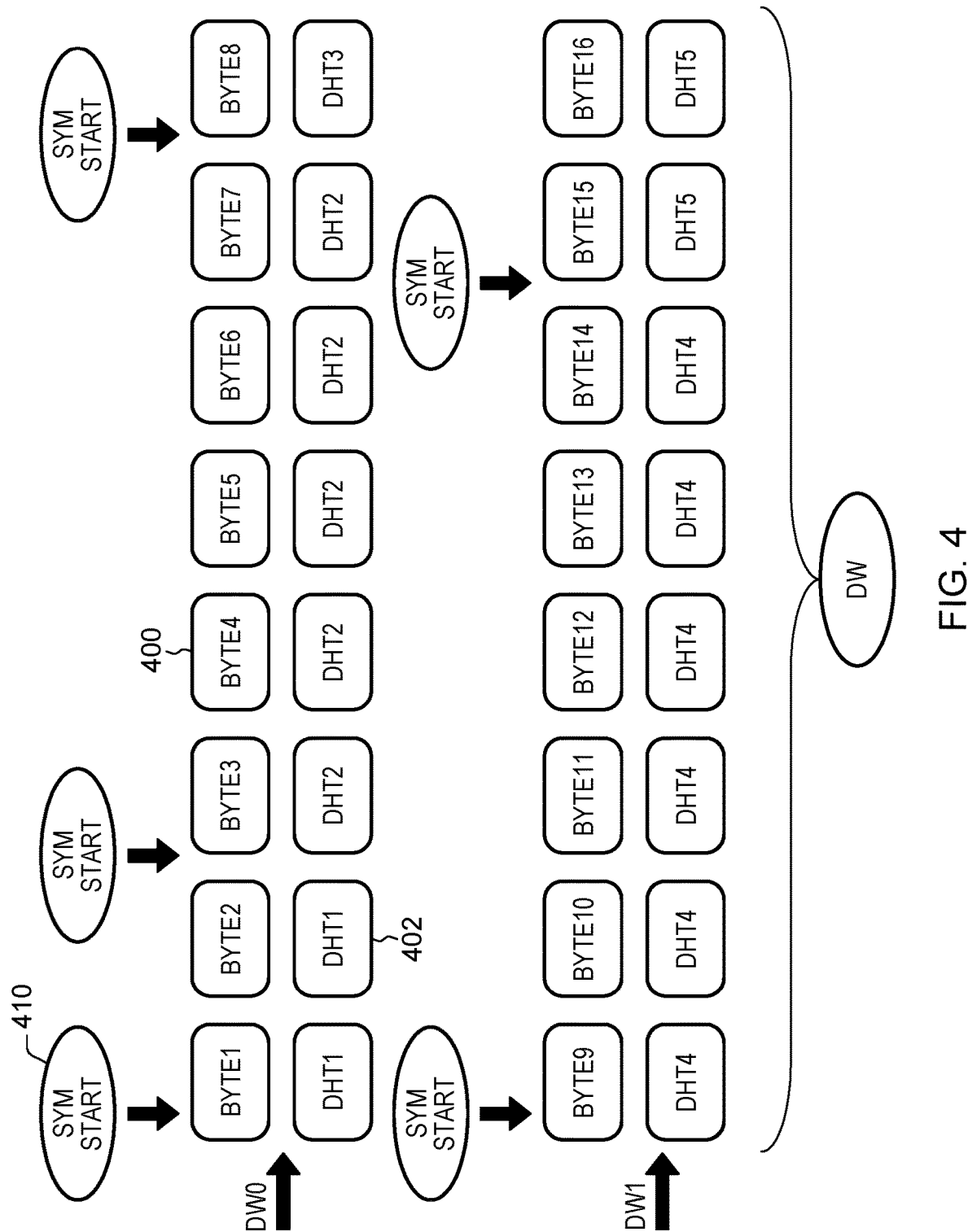
FIG. 4 depicts examples of units of decompressed data (e.g., double words (DWs) of decompressed data), in accordance with one or more aspects of the present invention.

Each compressed symbol may be decompressed using Huffman Tables, as an example. There are, for instance, Fixed Huffman Tables (FHT) and Dynamic Huffman Tables (DHT). If the symbol is decompressed using Dynamic Huffman Tables, then a DHT header is associated with each decompressed byte of data. The DHT header provides information used in decompressing the associated byte of data. As depicted in FIG. 4, a double word of decompressed data (e.g., DW0) includes 8 bytes of decompressed data 400 and each byte, in this example, includes a DHT header 402. As shown, in this particular example, Bytes 1 and 2 of DW0 are associated with a DHT1 header; Bytes 3-7 of DW0 are associated with a DHT2 header; and Byte 8 of DW0 is associated with a DHT3 header. Similarly, Bytes 9-14 of DW1 are associated with a DHT4 header, and Bytes 15-16 of DW1 are associated with a DHT5 header. These are just examples. In other examples, one or more of the bytes may not have an associated DHT header. For instance, if a Fixed Huffman Table is used in the decompressing, then the decompressed block will not have a DHT header associated therewith. Other variations are also possible.

Also depicted in FIG. 4 is a plurality of symbol start indicators 410. Each symbol start indicator specifies a start of a decompressed symbol. A symbol start indicator 410 may be anywhere within a unit of decompressed data, and a unit of decompressed data may include zero or more symbol start indicators.

Figure 5:
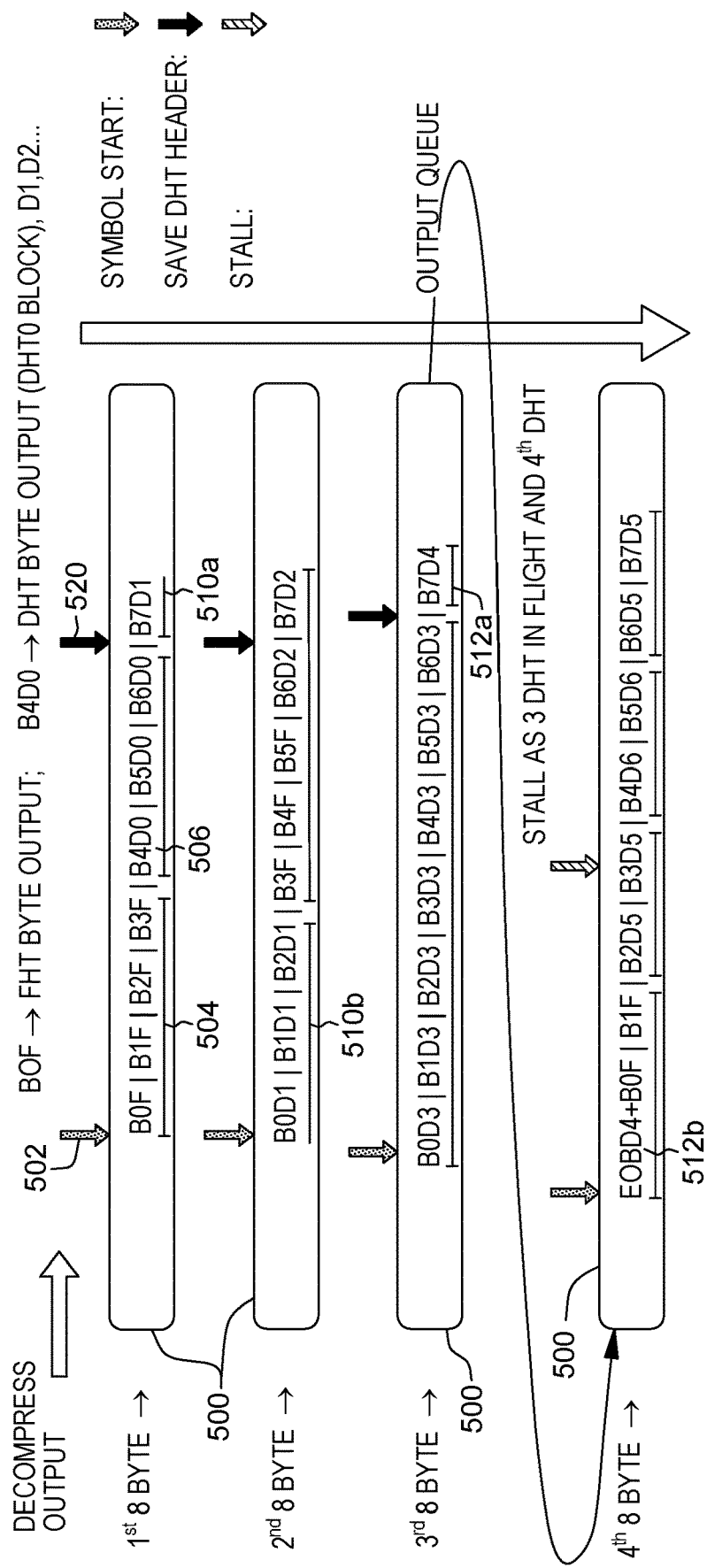
FIG. 5 depicts further examples of units of decompressed data with examples of symbol starts and selected Dynamic Huffman Table (DHT) headers, in accordance with one or more aspects of the present invention.

Further details regarding decompressed output are described with reference to FIG. 5. A plurality of units of decompressed data 500 (also referred to as decompressed data units, e.g., $1^{st}$ 8 byte (DW0)-$4^{th}$ 8 byte (DW3)) is depicted. In one example, each decompressed data unit 500 includes a first symbol start indicator 502 that indicates the start of a first decompressed symbol of a decompressed data unit. Further, each decompressed data unit includes one or more blocks of data 504, and each block 504 includes one or more bytes of data 506. A block of data 504 may overlap multiple decompressed data units, as shown at 510a, 510b. Additionally, in one example, an end of block indication of a particular block may overlap decompression data units, as shown at 512a, 512b. That is, E0BD4 is the end of block for B7D4. Other examples are also possible.

Although in the above example each first symbol start indicator 502 is shown at the beginning of a unit of decompressed data 500, this is only one example. The first symbol start, and thus, the first symbol start indicator, may be at any position within the decompressed data unit. Further, a unit of decompressed data 500 may not have a first symbol start. For example, assume that a first compressed symbol expands to 100 bytes and a decompressed data unit is 8 bytes. Then, it will take 13 DWs to hold the 100 bytes of data. The first DW includes a symbol start for the first compressed symbol, which is the first symbol start of the first DW for this example. The next 11 DWs in this example do not include any symbol starts, since the data is for the same symbol. The $13^{th}$ DW includes the last 4 decompressed bytes of the first compressed symbol and the $4^{th}$ byte of the $13^{th}$ DW marks the end of symbol (end 100 bytes). A second compressed symbol expands to 3 bytes and the $5^{th}$ byte of the $13^{th}$ DW includes a symbol start for the second compressed symbol. This is the first symbol start in the $13^{th}$ DW, and therefore, the first symbol start is reported to memory (e.g., a memory interface block used to write the data to memory) as being after 4 bytes. Additionally, assume a third compressed symbol expands to 5 bytes. Then, the $8^{th}$ byte of the $13^{th}$ DW is also a symbol start. However, in this example, this symbol start is not reported to memory because it is not the first symbol start of the $13^{th}$ DW. In accordance with an aspect of the present invention, a DW has, at most, one first symbol start that is saved and reported to memory. Many variations are possible. The examples provided herein are just examples and are not meant to be limiting in any way.

In accordance with an aspect of the present invention, the first symbol start of a DW is provided to the memory interface block (e.g., DMA like interface 142), such that the memory interface block, based on determining that writing to memory is to be stalled, may use the first symbol start to complete writing to memory the remaining decompressed data (e.g., remaining 4 bytes in the example above) of a compressed symbol already partially written to memory.

Further, in accordance with an aspect of the present invention, a selected DHT header 520 of each decompressed data unit that has associated DHT headers is saved. In one example, the DHT header that is selected to be saved for a decompressed data unit is a DHT header of a last decompressed symbol of the decompressed data unit. Other DHT headers of the decompressed data unit are not saved, in one embodiment. This enables successful trace back of the DHT header corresponding to the source that was processed depending on the variable target data committed. Further, a saved DHT header may be provided to, e.g., the memory interface block for use in restarting the writing of data from a target location to memory. As an example, if there was a stall in the above example in writing the $13^{th}$ DW from the queue to memory, then a DHT header of the $12^{th}$ DW corresponding to the last symbol written to memory is provided to the memory interface block and used in restarting the writing of the decompressed data of the second compressed symbol of the above example of the $13^{th}$ DW from the queue to the memory.

Figure 6A:
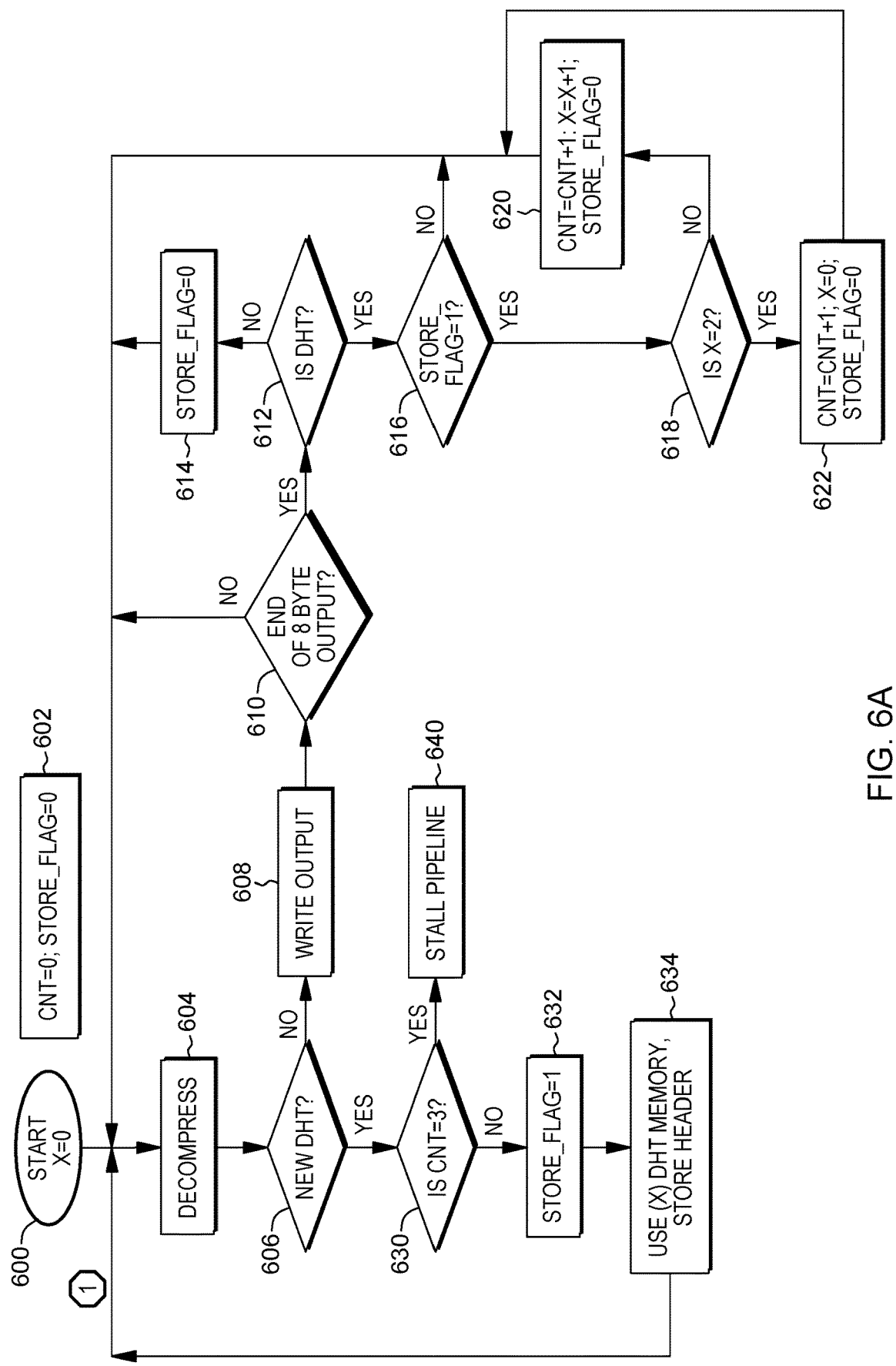
FIGS. 6A-6B depict one example of decompression processing, in accordance with one or more aspects of the present invention.
Figure 6B:
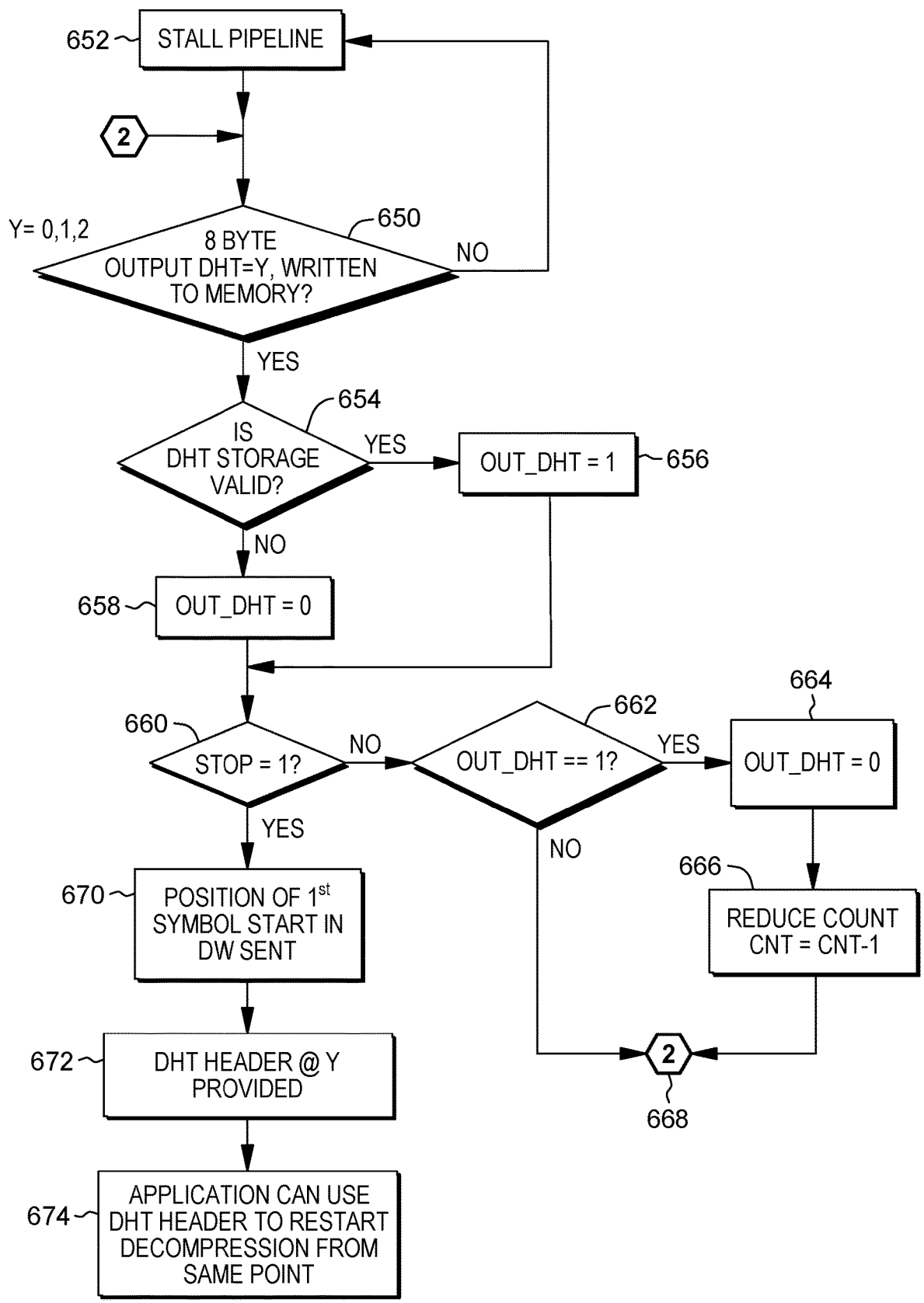

Further details regarding saving selected DHT headers and performing other aspects of a decompression operation are described with reference to FIGS. 6A-6B. The processing of FIGS. 6A-6B is performed by one or more components of a central processor chip (e.g., central processor chip 120), such as by an accelerator (e.g., accelerator 140), one or more processors (e.g., processor 130) and/or a memory interface block (e.g., DMA like interfaces 142). More, fewer and/or different components may also be used. In the description of the figures below, reference may be made to particular components, but again, this is only one example. Different, fewer and/or additional components may be used.

Referring to FIG. 6A, in one embodiment, in commencing the decompression process, an accelerator (e.g., accelerator 140) initializes a position variable, e.g., variable X, to a selected value, such as 0, STEP 600. Further, in one embodiment, accelerator 140 initializes a counter, e.g., CNT, to a selected value, such as 0; and a flag, referred to as Store_Flag, to a selected value, such as 0, STEP 602.

Additionally, accelerator 140 performs a decompress operation on a selected amount of compressed data (e.g., 1 byte or other size) of the input stream to produce a decompressed data byte (or other size), STEP 604. Accelerator 140 determines whether there is a new DHT header associated with the decompressed data byte, INQUIRY 606. If there is not a new DHT header associated with the decompressed data byte (i.e., DHT was not used in the decompression of the byte of data or the same DHT was used as the last byte of data that was decompressed), then accelerator 140 writes the decompressed output (and other previously decompressed output that has not been written) to a target location (e.g., a buffer, a queue, etc.) of, for instance, a memory interface block, such as interface 142, or other location, and the memory interface block begins writing the data from the queue to memory based on availability, STEP 608. Further, accelerator 140 determines whether the decompressed output represents the last byte of a unit of decompressed data of a defined size (e.g., 8 bytes), INQUIRY 610. If it is not the end of the unit of decompressed data (e.g., not the end of packaging of an 8 byte output), then processing continues to STEP 604 to decompress another byte of compressed data. However, if it is the end of the unit of decompressed data, then accelerator 140 determines whether the output data being written is associated with a current DHT header, INQUIRY 612.

If the output data is not associated with a current DHT header, then the flag, Store_Flag, is set equal to a selected value (e.g., 0), STEP 614, and processing continues with STEP 604. On the other hand, if the output data is associated with a current DHT header, then accelerator 140 further determines whether the flag, Store_Flag, is set to a particular value, e.g., 1, INQUIRY 616. If the Store_Flag is not set equal to the particular value, e.g., 1, then processing continues to STEP 604. Otherwise, if the flag, Store_Flag, is set to the particular value, e.g., 1, then accelerator 140 determines whether the variable X is set equal to a select value, e.g., 2, INQUIRY 618. If the variable X is not equal to the select value, then accelerator 140 increments the counter CNT by a predefined value, e.g., 1; increments the variable X by a prespecified value, e.g., 1; and sets Store_Flag to a selected value, e.g., 0, STEP 620. Processing continues to STEP 604. Otherwise, if the variable X is equal to the select value (e.g., 2), then accelerator 140 increments the counter CNT by the prespecified value, e.g., 1; resets the variable X to 0 indicating that a predefined number (e.g., 3) of DHT headers has already been saved, so the next saved DHT header will overwrite the first one, thereby saving memory space; and sets Store_Flag to a selected value, e.g., 0, STEP 622. Processing continues to STEP 604.

Returning to INQUIRY 606, if the decompressed data byte is associated with a new DHT header, then accelerator 140 further determines whether the counter CNT is set equal to a particular value, e.g., 3, INQUIRY 630. If the counter CNT is not set equal to the particular value, e.g., 3, then accelerator 140 sets Store_Flag to a particular value, e.g., 1, STEP 632. Further, accelerator 140 stores the header at (X) DHT memory, STEP 634. That is, the DHT header is stored at a position X (e.g., position 0, 1 or 2) at a selected location in memory. Processing continues with STEP 604.

Returning to INQUIRY 630, if the counter CNT is set equal to the particular value, e.g., 3, then the pipeline is stalled, STEP 640, since a predefined number of DWs (e.g., 3) are already in the pipeline and not yet stored to memory. Processing of the compressed data may resume when CNT is decremented, as described with reference to FIG. 6B.

Referring to FIG. 6B, in one embodiment, accelerator 140 determines whether the 8 byte output corresponding to DHT=Y (where Y is equal to 0, 1, or 2, since 3 DHT headers may be saved) has been written to memory, INQUIRY 650. If not, then the pipeline stalls, STEP 652.

If, however, the 8-byte output (i.e., DW) being checked has been written to memory, then the accelerator further determines whether the DHT storage is valid, INQUIRY 654. That is, does the DW stored in memory have a DHT header associated therewith? If the DHT storage is valid, the memory space may be released for further processing of the pipeline, as the current DW is committed to memory, and in one example, a variable, OUT_DHT is set equal to a select value (e.g., 1), STEP 656; otherwise, OUT_DHT is set equal to another select value (e.g., 0), STEP 658. Subsequent to setting OUT_DHT, processing continues to INQUIRY 660.

At INQUIRY 660, accelerator 140 determines whether it has received an indication that the writing from the target location (e.g., queue, buffer) in, e.g., the memory interface block to the memory is to stall (e.g., due to unavailable memory, or another reason) at least until at least one predefined criterion has been met (e.g., memory now available). If a flag, such as STOP, is set to a defined value (e.g., 0) indicating that the writing to memory is not to stall, then the accelerator further determines whether OUT_DHT has been set to the select value (e.g., to 1), INQUIRY 662. If not, then processing continues to STEP 650, as indicated by STEP 668. However, if the accelerator determines that OUT_DHT has been set to the select value (e.g., 1), then the accelerator resets it to another select value (e.g., 0), STEP 664, and reduces count, CNT, by a select value (e.g., 1), STEP 666. Processing continues to STEP 650, as indicated by STEP 668.

Returning to INQUIRY 660, if STOP is set equal to another defined value (e.g., 1), then the writing to memory has been stalled (e.g., stopped temporarily or interrupted) and accelerator 140 provides to, for instance, the memory interface block a position of the first symbol start in the unit of decompressed data that is to be written to memory next, STEP 670. Further, accelerator 140 provides the DHT header at Y to the memory interface, which is the DHT header corresponding to the last compressed symbol written to memory, STEP 672.

The application uses the DHT header (e.g., DHT header at Y), in accordance with an aspect of the present invention, to restart decompression from the same point at which it was stalled, STEP 674. Processing continues, for instance, at 1 in FIG. 6A. Since the decompression is restarted from the same point, any decompressed data already written to the queue beginning with the decompressed data of the symbol indicated by the first symbol start in STEP 670 is flushed from the queue. The use of the DHT header to restart decompression is further described with reference to FIG. 8 below.

Described herein is a capability to implement decompression using a Dynamic Huffman Table (DHT) with multiple data blocks in such a way that the decompression is performed with limited resources and obtains better performance. For instance, particular DHT headers and first symbol start positions are selected and used in writing decompressed data to memory. Further, a select DHT header (e.g., a DHT header of the last DW to be written to memory and corresponding to a last decompressed symbol written to memory) is used to restart decompression and to write the decompressed data to memory. In one example, a minimal number (e.g., 3) of select DHT headers is saved, thereby limiting memory resources to be used but still enabling progression in a decompression pipeline.

Figure 7:
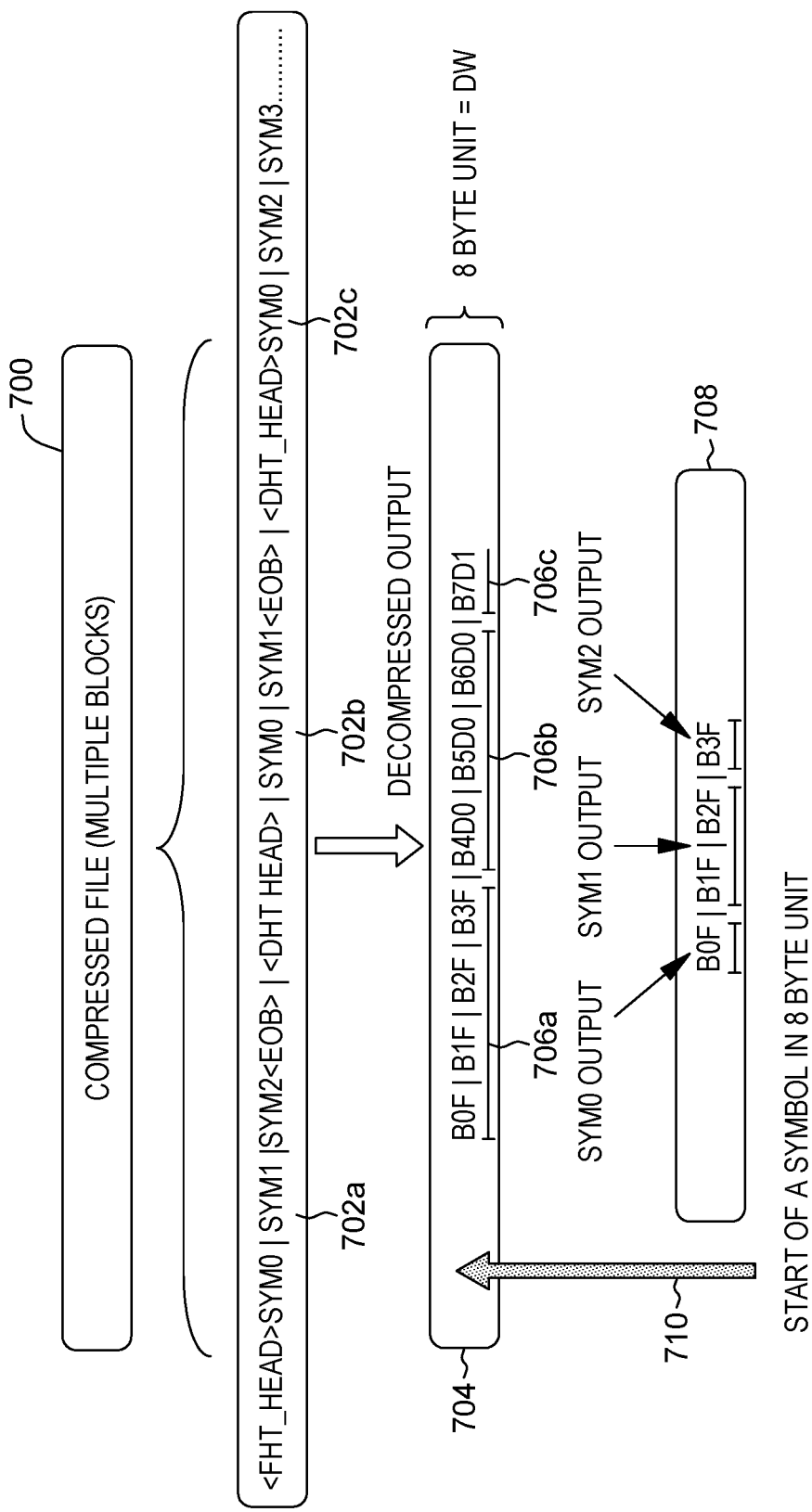
FIG. 7 depicts one example of details of a compressed file, in accordance with one or more aspects of the present invention.

One particular example of using one or more aspects of the present invention is described with reference to FIGS. 7-8. As shown in FIG. 7, a compressed file 700 includes multiple blocks of compressed data. For instance, compressed file 700 includes a block 702a (<FHT . . . EOB>), a block 702b (<DHT . . . EOB>), a block 702c (<DHT . . . ) . . . , etc. The compressed blocks are decompressed into a plurality of decompressed blocks, and the plurality of decompressed blocks are packaged into units of decompressed data (e.g., double words of decompressed data). One example of a unit of decompressed data 704 is shown, which includes a block of decompressed data 706a corresponding to compressed block 702a, a block of decompressed data 706b corresponding to compressed block 702b, and a partial block of decompressed data 706c corresponding to compressed block 702c, as an example.

Also shown in this example are symbol outputs 708 corresponding to decompressed block 706a, and a start of a symbol indicator 710 in unit of decompressed data 704. The symbol start indicator 710 specifies, for instance, a position of the start of a first symbol of the double word of data (e.g., symbol 0 output, e.g., B0F, in this example).

Figure 8:
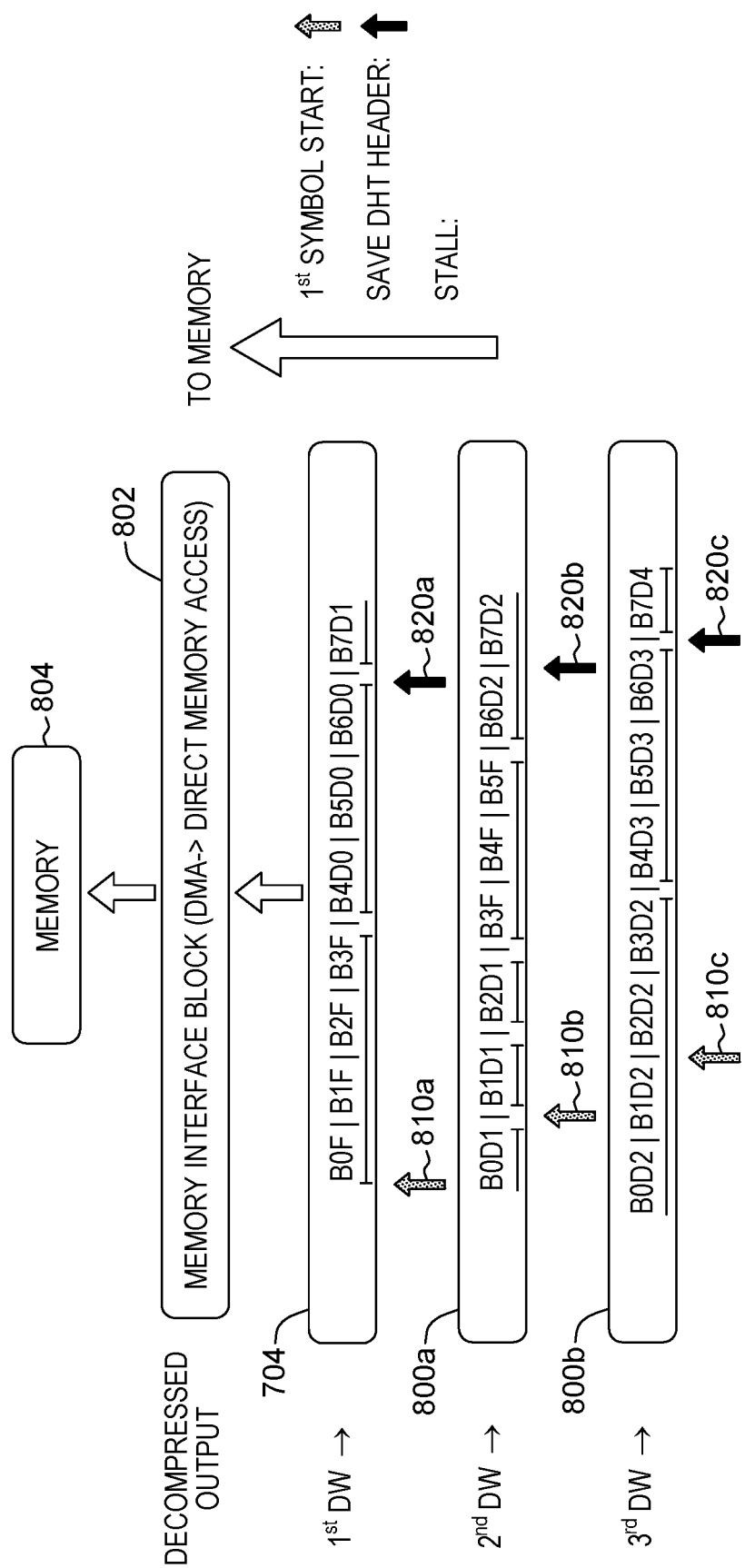
FIG. 8 depicts one example of decompressed output to be written to memory, in accordance with one or more aspects of the present invention.

Referring to FIG. 8, unit of decompressed data 704, as well as other units of decompressed data 800a, 800b (e.g., each DW), is written to a target location (e.g., buffer(s), queue(s)) in a memory interface block 802 by an accelerator (e.g., accelerator 140). Memory interface block 802 then writes the units of decompressed data to memory 804.

Each unit of decompressed data, in this particular example, has a first symbol start 810a-810c. For instance, the first symbol start for the first DW 704 is B0F 810a; the first symbol start for the second DW 800a is B1D1 810b; and the first symbol start for the third DW 800b is B2D2 810c. In one particular example, B6D2 and B7D2 of DW2 and B0D2 and B1D2 of DW3 are decompressed outputs of a Symbol 0; B2D2 is a decompressed output of a Symbol 1; and B3D2 is a decompressed output of a Symbol 2. Further, in this particular example, each unit of decompressed data has a select DHT header 820a-820c associated with a block of decompressed data. The select DHT header includes information based on decompressing the block associated therewith using a DHT. In the particular example of Symbols 0, 1 and 2, all 3 symbols have associated therewith the same DHT header (e.g., DHT header 2) 820*b*. Other examples are possible.

One specific example of using one or more aspects of the invention is described below: Assume there is space to save, e.g., 12 bytes of output to an available target page and that a next target page is unavailable. An accelerator (e.g., accelerator 140) maintains information of a first symbol start position in each DW output. The accelerator writes the first 8 bytes of data to memory interface block 802 as STOP=0 (there is space). The accelerator writes the second 8 bytes of data to memory interface block 802 as STOP=0. Further, the accelerator decrements CNT (e.g., CNT=CNT−1), since the first DHT header saved can be forgotten. When two DWs are written to memory, one DHT slot is freed.

The memory interface block saves 4 bytes of the second DW to memory and 4 bytes to a side buffer, since the memory page has space for 12 bytes of data. The memory interface block drives STOP=1 after the second DW write to the accelerator.

The accelerator determines that STOP=1, and stops at the next DW (e.g., the third DW). The accelerator sends the third DW with the following information—first symbol start=2, and a variable LAST=1. LAST=1 signals an end of the current operation with no further output from the accelerator. In this example, first symbol start is set equal to 2, which indicates that 2 bytes of data of the third DW belong to a previous decompressed symbol, which has a portion of decompressed data in one or more previous DWs and has spilled over to a current DW for two bytes. The byte at position 3 is the start of decompressed data of a new compressed symbol, which is the first symbol start, in the current DW. Two bytes of the current DW (first symbol start=2) are to be stored to memory, as they belong to a symbol which is already partially stored via a previous DW output.

The memory interface block saves 2 bytes of the third DW to the side buffer. The accelerator provides DHT header from position X=1 as part of the current block the accelerator stopped.

As described herein, the accelerator stops at the first symbol start for a DW if STOP=1. This enables the accelerator to save only the DHT header corresponding to the symbol before the first symbol start. Even if there are 8 bytes corresponding to 8 DHT blocks, the 8 DHT headers do not need to be saved. This saves memory, improves decompression processing and improves system performance. Further, more than one DHT block is allowed in the decompression pipeline at a given time, improving performance.

When the accelerator is requested to stop (e.g., STOP=1), the position source length of where the writing stopped, the current block DHT header (i.e., the DHT header corresponding to the symbol before the first symbol start) and optionally other information are provided in order to restart the writing from the same position. A minimum number of DHT storage can be used such that the accelerator can progress in decompression without stalling the pipeline too frequently (e.g., after each byte that is written).

Assume in the above example that the accelerator was in the middle of decompression of a DHT block, when there was a stop at the second byte of DW3 at the end of an expanded symbol which spilled over from DW2 to DW3. The next two symbols are part of that DHT block and will use the same DHT header for decompression. When there is a stop at byte 2 of DW3, the following information, in one example, is reported to the memory interface block: DHT header D2 (such that this can be stored with the decompressed output of the next symbol(s) to use this header), source processed until byte 2 of DW3, and DHT block=1 indicating that the decompression is in the middle of the DHT block. When there is a resume later, the start is from a next point (ended at position SRC, restart at position SRC+1). Thus, the DHT header is provided such that the header can be used to decompress the symbol(s) for this particular block.

In accordance with one or more aspects, in one specific example, the first symbol start, if any, of each unit of output (e.g., each 8 byte output) is pushed onto an output queue. When the hardware (e.g., accelerator) is asked to stop, the hardware stops at the first symbol start of a next 8 byte unit. The hardware retains the information that is to be used to restart (including DHT header, source processed and other information) based on the first symbol start of an 8 byte unit. A minimal number of DHT header storage is used while progress is made without stalling the pipeline frequently. As an example, 3 DHT memory blocks are used to store DHT headers, which may be used to report the DHT, when the hardware stops on the first symbol start of an 8 byte unit.

In one or more aspects, decompressed output is written in units of n bytes (e.g., 8 bytes=1 DW). Each byte output may represent an independent DHT block. In order to have the next unit of n bytes be ready to be written to memory, the minimum number of DHT header/blocks which are to be in flight is, e.g., three. That is, each n byte of data written out uses, at most, one memory block to contain a DHT header for the block. One memory block is released when two n byte units are written out. Two memory blocks are used to hold DHT headers corresponding to two n byte units. The third memory block is used to make progress in generating a next n byte unit output.

One or more aspects of the present invention are inextricably tied to computer technology and facilitate processing within a computer, improving performance thereof. Embodiments of the present invention are inextricably tied to computing at least because they are directed to addressing an issue that is unique to computing (e.g., compression/decompression of data) and provides a technical approach that is also within this sphere. Given that both the issue and the approach are specific to computing, embodiments of the present invention are inextricably tied to computing.

Figure 9A:
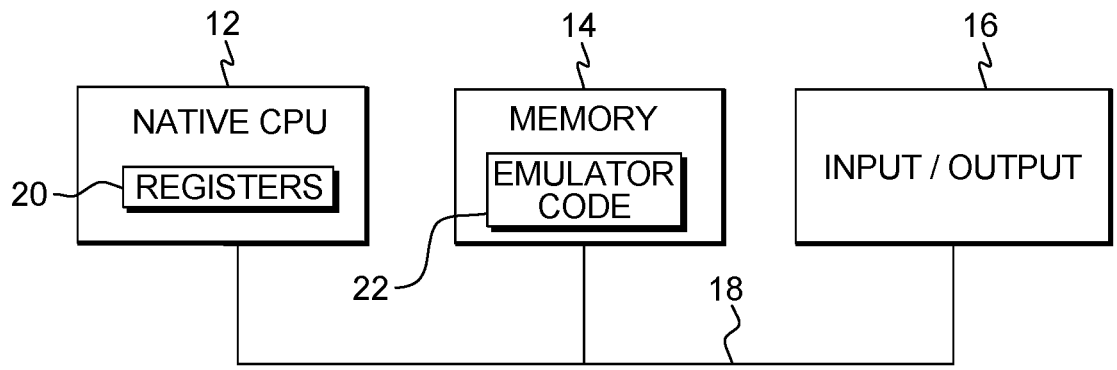
FIG. 9A depicts another example of a computing environment to incorporate and use one or more aspects of the present invention.

Other types of computing environments may also incorporate and use one or more aspects of the present invention, including, but not limited to, emulation environments, an example of which is described with reference to FIG. 9A. In this example, a computing environment 10 includes, for instance, a native central processing unit (CPU) 12, a memory 14, and one or more input/output devices and/or interfaces 16 coupled to one another via, for example, one or more buses 18 and/or other connections. As examples, computing environment 10 may include a PowerPC® processor offered by International Business Machines Corporation, Armonk, N.Y.; and/or other machines based on architectures offered by International Business Machines Corporation, Intel Corporation, or other companies. PowerPC is a trademark or registered trademark of International Business Machines Corporation in at least one jurisdiction. Intel is a trademark or registered trademark of Intel Corporation or its subsidiaries in the United States and other countries.

Native central processing unit 12 includes one or more native registers 20, such as one or more general purpose registers and/or one or more special purpose registers used during processing within the environment. These registers include information that represents the state of the environment at any particular point in time.

Moreover, native central processing unit 12 executes instructions and code that are stored in memory 14. In one particular example, the central processing unit executes emulator code 22 stored in memory 14. This code enables the computing environment configured in one architecture to emulate another architecture. For instance, emulator code 22 allows machines based on architectures other than the z/Architecture hardware architecture, such as PowerPC processors, or other servers or processors, to emulate the z/Architecture hardware architecture and to execute software and instructions developed based on the z/Architecture hardware architecture.

Figure 9B:
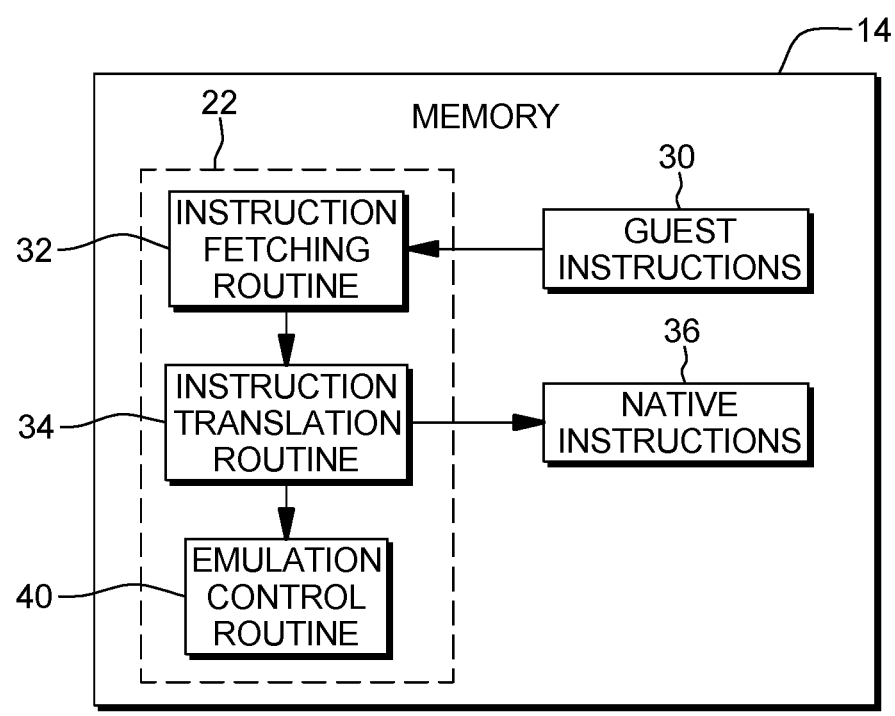
FIG. 9B depicts further details of the memory of FIG. 9A.

Further details relating to emulator code 22 are described with reference to FIG. 9B. Guest instructions 30 stored in memory 14 comprise software instructions (e.g., correlating to machine instructions) that were developed to be executed in an architecture other than that of native CPU 12. For example, guest instructions 30 may have been designed to execute on a z/Architecture processor, but instead, are being emulated on native CPU 12, which may be, for example, an Intel processor. In one example, emulator code 22 includes an instruction fetching routine 32 to obtain one or more guest instructions 30 from memory 14, and to optionally provide local buffering for the instructions obtained. It also includes an instruction translation routine 34 to determine the type of guest instruction that has been obtained and to translate the guest instruction into one or more corresponding native instructions 36. This translation includes, for instance, identifying the function to be performed by the guest instruction and choosing the native instruction(s) to perform that function.

Further, emulator code 22 includes an emulation control routine 40 to cause the native instructions to be executed. Emulation control routine 40 may cause native CPU 12 to execute a routine of native instructions that emulate one or more previously obtained guest instructions and, at the conclusion of such execution, return control to the instruction fetch routine to emulate the obtaining of the next guest instruction or a group of guest instructions. Execution of native instructions 36 may include loading data into a register from memory 14; storing data back to memory from a register; or performing some type of arithmetic or logic operation, as determined by the translation routine.

Each routine is, for instance, implemented in software, which is stored in memory and executed by native central processing unit 12. In other examples, one or more of the routines or operations are implemented in firmware, hardware, software or some combination thereof. The registers of the emulated processor may be emulated using registers 20 of the native CPU or by using locations in memory 14. In embodiments, guest instructions 30, native instructions 36 and emulator code 22 may reside in the same memory or may be disbursed among different memory devices.

As used herein, firmware includes, e.g., the microcode of the processor. It includes, for instance, the hardware-level instructions and/or data structures used in implementation of higher level machine code. In one embodiment, it includes, for instance, proprietary code that is typically delivered as microcode that includes trusted software or microcode specific to the underlying hardware and controls operating system access to the system hardware.

A guest instruction 30 that is obtained, translated and executed may be, for instance, one of the instructions described herein. The instruction, which is of one architecture (e.g., the z/Architecture hardware architecture), is fetched from memory, translated and represented as a sequence of native instructions 36 of another architecture (e.g., PowerPC, Intel, etc.). These native instructions are then executed.

One or more aspects may relate to cloud computing.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 10:
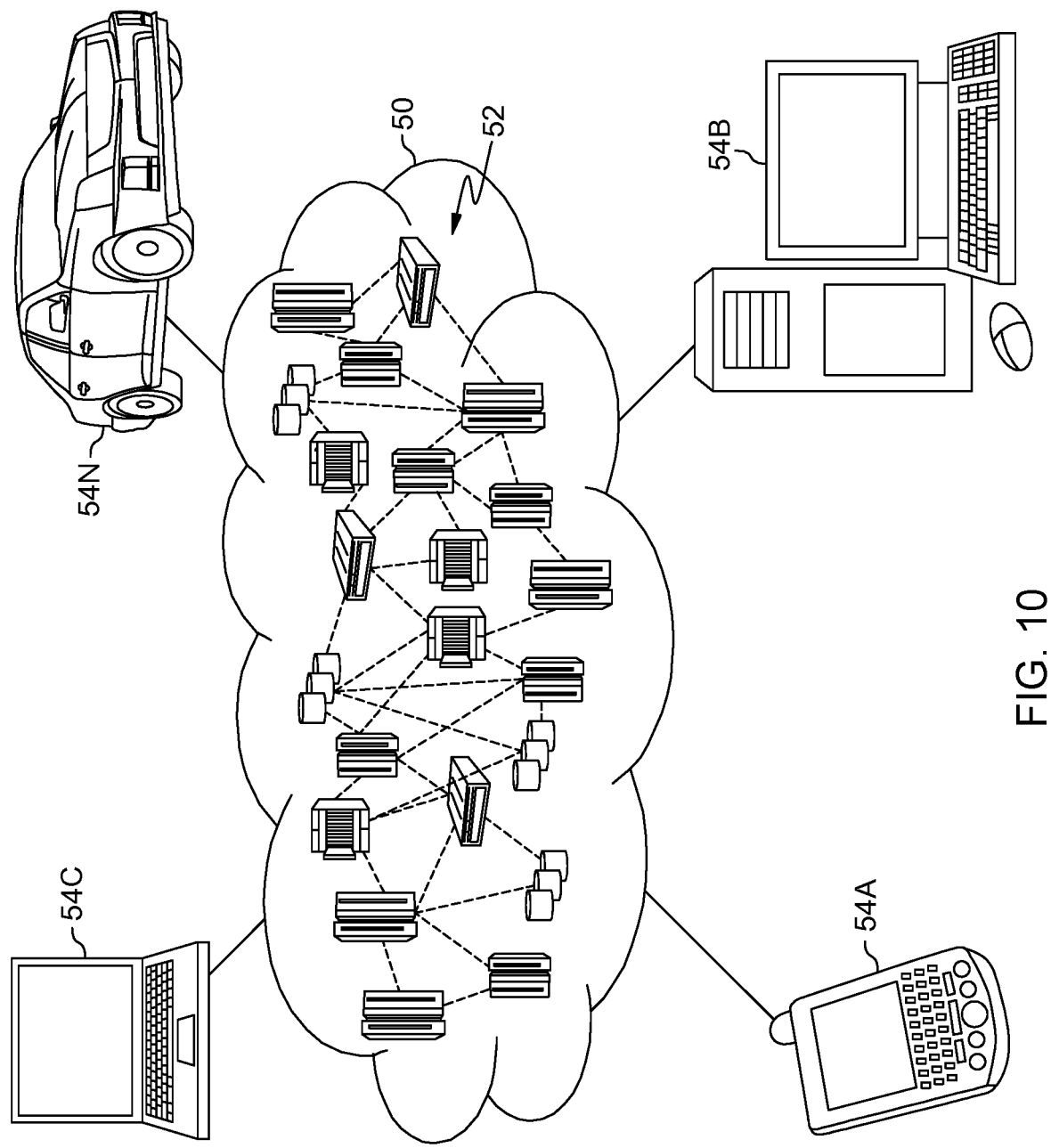
FIG. 10 depicts one embodiment of a cloud computing environment.

Referring now to FIG. 10, illustrative cloud computing environment 50 is depicted. As shown, cloud computing environment 50 includes one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 10 are intended to be illustrative only and that computing nodes 52 and cloud computing environment 50 can communicate with any type of computerized device over any type of network and/or network addressable connection (e.g., using a web browser).

Figure 11:
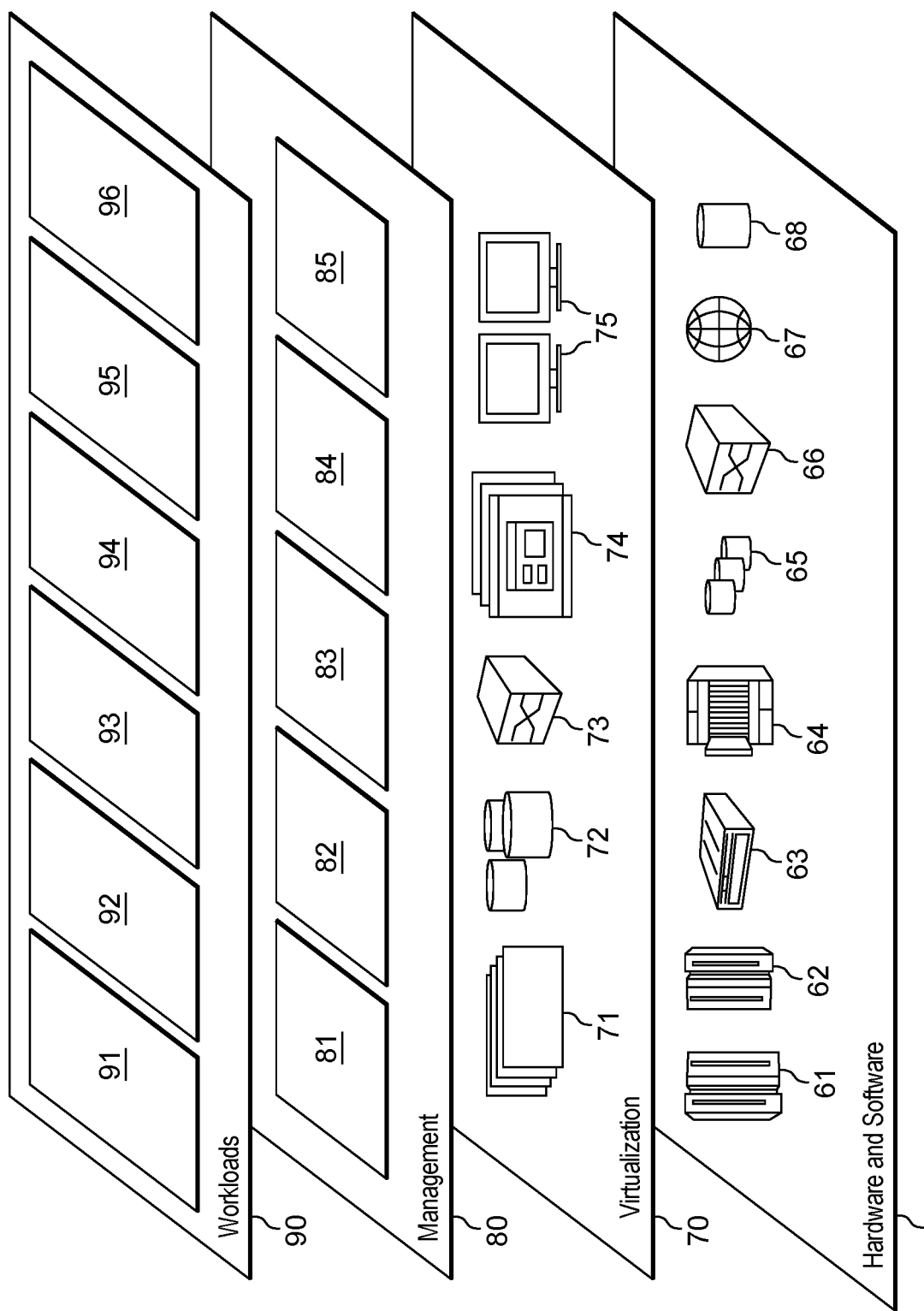
FIG. 11 depicts one example of abstraction model layers.

Referring now to FIG. 11, a set of functional abstraction layers provided by cloud computing environment 50 (FIG. 10) is shown. It should be understood in advance that the components, layers, and functions shown in FIG. 11 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and decompression processing 96.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally, or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, computing environments of other architectures can be used to incorporate and use one or more embodiments. Further, different instructions or operations may be used. Moreover, other compression/decompression techniques may be used. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A computer program product for facilitating processing within a computing environment, the computer program product comprising:
   at least one computer readable storage medium readable by at least one processing circuit and storing instructions for performing a method comprising:
      writing one or more units of decompressed data of a plurality of units of decompressed data to a target location for subsequent writing to memory, the plurality of units of decompressed data including a plurality of symbol outputs and having associated therewith a plurality of decompression headers, wherein a decompression header of the plurality of decompression headers includes information relating to decompression of data of a unit of decompressed data of the plurality of units of decompressed data;
      selecting, for the plurality of units of decompressed data, one or more selected decompression headers to be saved, the one or more selected decompression headers being fewer than the plurality of decompression headers associated with the plurality of units of decompressed data;
      saving at least a portion of the one or more selected decompression headers, the at least a portion of the one or more selected decompression headers including a selected decompression header of a selected unit of decompressed data of the one or more units of decompressed data written to the target location, wherein the selected decompression header to be saved is a decompression header corresponding to a last decompressed symbol written to memory;
      determining that the subsequent writing to memory of at least a portion of another unit of decompressed data of the plurality of units of decompressed data to be written to the target location is to be stalled, the other unit of decompressed data comprising one or more symbol outputs of the plurality of symbol outputs;
      determining a symbol start position of a selected symbol output of the one or more symbol outputs of the other unit of decompressed data, the symbol start position being at any position within the other unit of decompressed data and representing a first symbol start in the other unit of decompressed data, the first symbol start of the other unit of decompressed data being saved, and wherein other symbol starts of other symbol outputs of the other unit of decompressed data are not saved; and
      providing the symbol start position and the selected decompression header to a component of the computing environment, wherein at least the selected decompression header is to be used for the subsequent writing of the other unit of decompressed data from the target location to memory.

2. The computer program product of claim 1, wherein the saving the at least a portion of the one or more selected decompression headers comprises saving a determined number of the one or more selected decompression headers, wherein the determined number enables progress to continue in a decompression pipeline while using a limited amount of memory.

3. The computer program product of claim 2, wherein the limited amount of memory comprises an amount of memory to store three selected decompression headers, the three selected decompression headers corresponding to three units of decompressed data of the plurality of units of decompressed data, and wherein other decompression headers for the plurality of units of decompressed data are not saved.

4. The computer program product of claim 1, wherein the plurality of units of decompressed data comprises a plurality of blocks of decompressed data, wherein a block of decompressed data of the plurality of blocks of decompressed data is located in one or more units of decompressed data of the plurality of units of decompressed data, and wherein one or more blocks of decompressed data of the plurality of blocks of decompressed data has one or more decompression headers associated therewith.

5. The computer program product of claim 1, wherein the method further comprises restarting the writing of the other unit of decompressed data to the memory, wherein the restarting uses the selected decompression header.

6. The computer program product of claim 1, wherein the selected symbol output comprises a first symbol output of the other unit of decompressed data to have a first symbol start position in the other unit of decompressed data, and the selected decompression header comprises the decompression header of a last unit of decompressed data written to memory.

7. The computer program product of claim 1, wherein the determining the subsequent writing is to be stalled comprises receiving an indication from the component that the subsequent writing is to stall.

8. The computer program product of claim 1, wherein the target location comprises a buffer to be accessed by a memory interface block, and wherein the method further comprises writing at least a portion of the one or more units of decompressed data by the memory interface block from the buffer to memory.

9. The computer program product of claim 1, wherein the target location comprises a queue to be accessed by a memory interface block, and wherein the method further comprises writing at least a portion of the one or more units of decompressed data by the memory interface block from the queue to memory.

10. The computer program product of claim 1, wherein the component is a memory interface block, and wherein the other symbol start positions of the other symbol outputs of the other unit of decompressed data are not provided to the memory interface block.

11. A system for facilitating processing within a computing environment, the system comprising:
a memory; and
one or more components in communication with the memory, wherein the system is configured to perform a method, said method comprising:
writing one or more units of decompressed data of a plurality of units of decompressed data to a target location for subsequent writing to memory, the plurality of units of decompressed data including a plurality of symbol outputs and having associated therewith a plurality of decompression headers, wherein a decompression header of the plurality of decompression headers includes information relating to decompression of data of a unit of decompressed data of the plurality of units of decompressed data;
selecting, for the plurality of units of decompressed data, one or more selected decompression headers to be saved, the one or more selected decompression headers being fewer than the plurality of decompression headers associated with the plurality of units of decompressed data;
saving at least a portion of the one or more selected decompression headers, the at least a portion of the one or more selected decompression headers including a selected decompression header of a selected unit of decompressed data of the one or more units of decompressed data written to the target location, wherein the selected decompression header to be saved is a decompression header corresponding to a last decompressed symbol written to memory;
determining that the subsequent writing to memory of at least a portion of another unit of decompressed data of the plurality of units of decompressed data to be written to the target location is to be stalled, the other unit of decompressed data comprising one or more symbol outputs of the plurality of symbol outputs;
determining a symbol start position of a selected symbol output of the one or more symbol outputs of the other unit of decompressed data, the symbol start position being at any position within the other unit of decompressed data and representing a first symbol start in the other unit of decompressed data, the first symbol start of the other unit of decompressed data being saved, and wherein other symbol starts of other symbol outputs of the other unit of decompressed data are not saved; and
providing the symbol start position and the selected decompression header to a component of the computing environment, wherein at least the selected decompression header is to be used for the subsequent writing of the other unit of decompressed data from the target location to memory.

12. The computer system of claim 11, wherein the plurality of units of decompressed data comprises a plurality of blocks of decompressed data, wherein a block of decompressed data of the plurality of blocks of decompressed data is located in one or more units of decompressed data of the plurality of units of decompressed data, and wherein one or more blocks of decompressed data of the plurality of blocks of decompressed data has one or more decompression headers associated therewith.

13. The computer system of claim 11, wherein the saving the at least a portion of the one or more selected decompression headers comprises saving a determined number of the one or more selected decompression headers, wherein the determined number enables progress to continue in a decompression pipeline while using a limited amount of memory.

14. The computer system of claim 11, wherein the method further comprises restarting the writing of the other unit of decompressed data to memory, wherein the restarting uses the selected decompression header.

15. The computer system of claim 11, wherein the selected symbol output comprises a first symbol output of the other unit of decompressed data a first symbol start position in the other unit of decompressed data, and the selected decompression header comprises the decompression header of a last unit of decompressed data written to memory.

16. A computer-implemented method of facilitating processing within a computing environment, the computer-implemented method comprising:
writing one or more units of decompressed data of a plurality of units of decompressed data to a target location for subsequent writing to memory, the plurality of units of decompressed data including a plurality of symbol outputs and having associated therewith a plurality of decompression headers, wherein a decompression header of the plurality of decompression headers includes information relating to decompression of data of a unit of decompressed data of the plurality of units of decompressed data;
selecting, for the plurality of units of decompressed data, one or more selected decompression headers to be saved, the one or more selected decompression headers being fewer than the plurality of decompression headers associated with the plurality of units of decompressed data;
saving at least a portion of the one or more selected decompression headers, the at least a portion of the one or more selected decompression headers including a selected decompression header of a selected unit of decompressed data of the one or more units of decompressed data written to the target location, wherein the selected decompression header to be saved is a decompression header corresponding to a last decompressed symbol written to memory;

determining that the subsequent writing to memory of at least a portion of another unit of decompressed data of the plurality of units of decompressed data to be written to the target location is to be stalled, the other unit of decompressed data comprising one or more symbol outputs of the plurality of symbol outputs;

determining a symbol start position of a selected symbol output of the one or more symbol outputs of the other unit of decompressed data, the symbol start position being at any position within the other unit of decompressed data and representing a first symbol start in the other unit of decompressed data, the first symbol start of the other unit of decompressed data being saved, and wherein other symbol starts of other symbol outputs of the other unit of decompressed data are not saved; and providing the symbol start position and the selected decompression header to a component of the computing environment, wherein at least the selected decompression header is to be used for the subsequent writing of the other unit of decompressed data from the target location to memory.

17. The computer-implemented method of claim 16, wherein the plurality of units of decompressed data comprises a plurality of blocks of decompressed data, wherein a block of decompressed data of the plurality of blocks of decompressed data is located in one or more units of decompressed data of the plurality of units of decompressed data, and wherein one or more blocks of decompressed data of the plurality of blocks of decompressed data has one or more decompression headers associated therewith.

18. The computer-implemented method of claim 16, wherein the saving the at least a portion of the one or more selected decompression headers comprises saving a determined number of the one or more selected decompression headers, wherein the determined number enables progress to continue in a decompression pipeline while using a limited amount of memory.

19. The computer-implemented method of claim 16, further comprising restarting the writing of the other unit of decompressed data to memory, wherein the restarting uses the selected decompression header.

20. The computer-implemented method of claim 16, wherein the selected symbol output comprises a first symbol output of the other unit of decompressed data to have a first symbol start position in the other unit of decompressed data, and the selected decompression header comprises the decompression header of a last unit of decompressed data written to memory.

* * * * *